United States Patent
Hosoya

(10) Patent No.: US 9,634,129 B2
(45) Date of Patent: Apr. 25, 2017

(54) INSULATED GATE BIPOLAR TRANSISTOR (IGBT) AND RELATED METHODS

(71) Applicant: SEMICONDUCTOR COMPONENTS INDUSTRIES, LLC, Phoenix, AZ (US)

(72) Inventor: Takumi Hosoya, Isesaki (JP)

(73) Assignee: SEMICONDUCTOR COMPONENT INDUSTRIES, LLC, Phoenix, AZ (US)

( * ) Notice: Subject to any disclaimer, the term of this patent is extended or adjusted under 35 U.S.C. 154(b) by 17 days.

(21) Appl. No.: 14/728,099

(22) Filed: Jun. 2, 2015

(65) Prior Publication Data

US 2016/0359025 A1    Dec. 8, 2016

(51) Int. Cl.
*H01L 29/66* (2006.01)
*H01L 29/739* (2006.01)

(52) U.S. Cl.
CPC .... *H01L 29/7397* (2013.01); *H01L 29/66348* (2013.01)

(58) Field of Classification Search
CPC .......... H01L 29/7397; H01L 29/66348; H01L 29/66325; H01L 29/7393; H01L 29/7395; H01L 29/1095; H01L 29/4236; H01L 29/66734
USPC ......... 257/44, 197, 330, 370, 474, 511, 565, 257/575; 438/133, 170, 189, 234, 270, 438/309
See application file for complete search history.

(56) References Cited

U.S. PATENT DOCUMENTS

| 2002/0179976 A1* | 12/2002 | Takahashi ............ H01L 29/407 257/370 |
| 2010/0327313 A1* | 12/2010 | Nakamura .......... H01L 29/0834 257/133 |
| 2015/0295071 A1* | 10/2015 | Hikasa ............. H01L 21/02216 257/144 |

FOREIGN PATENT DOCUMENTS

EP    12099751 A2    5/2002

OTHER PUBLICATIONS

Semiconductor Components Industries, LLC, NGTB20N120IHRWG—IGBT with Monolithic Free Wheeling Diode, Oct. 2013.
Semiconductor Components Industries, LLC, NGTB30N60L2WG—High Speed SW & Low VCE(sat) Application of the IGBT, Jun. 2014.

* cited by examiner

*Primary Examiner* — Jarrett Stark
*Assistant Examiner* — Shahed Ahmed
(74) *Attorney, Agent, or Firm* — Adam R. Stephenson, Ltd.

(57) ABSTRACT

An insulated gate bipolar transistor (IGBT) includes a gate trench, an emitter trench, and an electrically insulative layer coupled to the emitter trench and the gate trench and electrically isolating the gate trench from an electrically conductive layer. A contact opening in the electrically insulative layer extends into the emitter trench and the electrically conductive layer electrically couples with the emitter trench therethrough. A P surface doped (PSD) region and an N surface doped (NSD) region are each located between the electrically conductive layer and a plurality of semiconductor layers of the IGBT and between the gate trench and the emitter trench. The electrically conductive layer electrically (Continued)

couples to the plurality of semiconductor layers through the PSD region and/or the NSD region.

10 Claims, 6 Drawing Sheets

INSULATED GATE BIPOLAR TRANSISTOR (IGBT) AND RELATED METHODS

BACKGROUND

1. Technical Field

Aspects of this document relate generally to insulated gate bipolar transistors (IGBTs). Aspects of this document also relate generally to injection enhanced gate transistors (IEGTs).

2. Background Art

Insulated gate bipolar transistors (IGBTs) are often used as switches. An IGBT generally combines an isolated gate field-effect transistor (FET), such as a metal-oxide-semiconductor FET (MOSFET) for the control input, with a bipolar power transistor switch, such as a bipolar junction transistor (BJT). IGBTs are generally minority carrier devices with fast switching characteristics, high efficiency, high input impedance, and large bipolar current-carrying capability. IGBTs are generally used in medium to high power applications.

SUMMARY

Implementations of insulated gate bipolar transistors (IGBTs) may include: a gate trench; an emitter trench; an electrically insulative layer coupled to the emitter trench and to the gate trench and electrically isolating the gate trench from an electrically conductive layer, and; an opening in the electrically insulative layer that extends into the emitter trench and through which the electrically conductive layer electrically couples with the emitter trench; wherein the gate trench, the emitter trench, the electrically insulative layer and the electrically conductive layer form at least a part of the insulated gate bipolar transistor (IGBT).

Implementations of IGBTs may include one, all, or any of the following:

A P surface doped (PSD) region and an N surface doped (NSD) region may each be located between the electrically conductive layer and a plurality of semiconductor layers of the IGBT.

The PSD region and the NSD region may substantially not overlap.

The PSD region and the NSD region may be located between the gate trench and the emitter trench and the electrically conductive layer may be electrically coupled to the plurality of semiconductor layers through the PSD region and/or the NSD region.

The IGBT may include a plurality of semiconductor layers including at least a P+ layer, a P– layer, and an N– layer between the P+ layer and the P– layer.

An N+ layer may be included between the P+ layer and the N– layer.

The gate trench and the emitter trench may each extend into at least two semiconductor layers of the IGBT.

The gate trench may be electrically insulated from a plurality of semiconductor layers of the IGBT using an insulator.

The IGBT may further include a plurality of semiconductor layers and the emitter trench may not be electrically coupled with the plurality of semiconductor layers except through the electrically conductive layer.

Implementations of IGBTs may include: a gate trench; a first emitter trench; a second emitter trench; a diode trench; one or more inactive trenches; an electrically insulative layer coupled to the gate trench, the first emitter trench, the second emitter trench, the diode trench and the one or more inactive trenches, electrically isolating the gate trench, the one or more inactive trenches, and the diode trench from an electrically conductive layer; a first opening in the electrically insulative layer that extends into the first emitter trench and through which the electrically conductive layer electrically couples with the first emitter trench, and; a second opening in the electrically insulative layer that extends into the second emitter trench and through which the electrically conductive layer electrically couples with the second emitter trench.

Implementations of IGBTs may include one, all, or any of the following:

The electrically conductive layer may be electrically coupled to a plurality of semiconductor layers between the gate trench and the first emitter trench through a P surface doped (PSD) region and/or an N surface doped (NSD) region.

The IGBT may include a P surface doped (PSD) region and an N surface doped (NSD) region, the PSD region and the NSD region each located between the electrically conductive layer and a plurality of semiconductor layers and also located between the gate trench and the first emitter trench.

A P surface doped (PSD) region may be located between the electrically conductive layer and a plurality of semiconductor layers of the IGBT and may also be located between the diode trench and the second emitter trench.

The gate trench and the diode trench may be electrically insulated from a plurality of semiconductor layers of the IGBT using an insulator.

The IGBT may include a plurality of semiconductor layers and the first emitter trench and the second emitter trench may not be electrically coupled with the plurality of semiconductor layers except through the electrically conductive layer.

The IGBT may include a plurality of semiconductor layers including at least a P+ layer, a P– layer, and an N– layer between the P+ layer and the P– layer.

An N+ layer may be included between the P+ layer and the N– layer.

Implementations of methods of forming an IGBT may include: forming a plurality of semiconductor layers; forming a plurality of trenches in the plurality of semiconductor layers by removing portions of the plurality of semiconductor layers; forming an electrically insulative coating/layer on an inner wall of each of the plurality of trenches; substantially filling each of the plurality of trenches with a trench material to form at least one gate trench and at least one emitter trench; forming an N surface doped (NSD) region coupled with the plurality of semiconductor layers; forming an electrically insulative layer over the plurality of semiconductor layers; removing a portion of the electrically insulative layer to create a contact opening in the at least one emitter trench and simultaneously exposing the NSD region; forming a P surface doped (PSD) region coupled with the plurality of semiconductor layers, and; forming an electrically conductive layer over the electrically insulative layer, wherein the electrically conductive layer electrically couples with the at least one emitter trench through the contact opening.

Implementations of IGBTs may include one, all, or any of the following:

Forming the electrically conductive layer may include electrically coupling the at least one emitter trench with the plurality of semiconductor layers through the NSD region and/or the PSD region.

Creating the contact opening may include removing a portion of the trench material filling the at least one emitter trench to form an exposed surface of the trench material, and forming the electrically conductive layer may include contacting the exposed surface with the electrically conductive layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended insulated gate bipolar transistors (IGBTs) and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such IGBTs and related methods, and implementing components and methods, consistent with the intended operation and methods.

Figure 1:
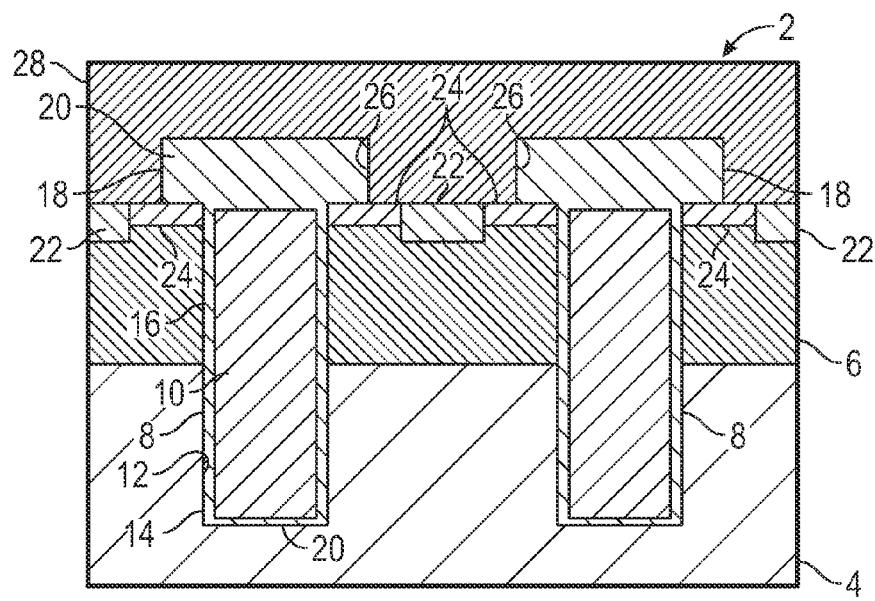
FIG. 1 is a cross-section view of conventional insulated gate bipolar transistor (IGBT)

Referring now to FIG. 1, a cross-section view of a conventional insulated gate bipolar transistor (IGBT) 2 is shown. IGBT 2 is a non-punch through IGBT. A plurality of semiconductor layers are used to form the conventional IGBT, including an N− semiconductor layer 4 and a P− semiconductor layer 6 (channel layer). A pair of gate trenches 8 are shown, each having an inner wall 12 that is coated/layered with an electrically insulative coating/layer 14 formed of an insulator 16, which may be $SiO_2$. The electrically insulative coating electrically insulates the gate trench from the plurality of semiconductor layers. The gate trenches are filled with a trench material 10 which may be an electrical conductor, a metal, a doped polysilicon material, and the like. A plurality of P surface doped (PSD) regions 22 are included, which may be P+ regions. In various implementations the PSD regions may be referred to as "body" regions.

A plurality of N surface doped (NSD) regions 24 are also included, which may be N+ regions. An electrically insulative layer 18 is formed using an insulator 20 which may be $SiO_2$. A plurality of contact openings 26 are formed in the electrically insulative layer, each contact opening allowing an electrically conductive layer 28 to electrically couple with a PSD region and two NSD regions. The electrically conductive layer may be formed of aluminum or any other electrically conductive material. The electrically insulative layer electrically isolates the gate trenches from the electrically conductive layer. An injection/collector semiconductor layer, which may be a P+ semiconductor layer, may be included below (and coupled with) semiconductor layer 4.

Figure 2:
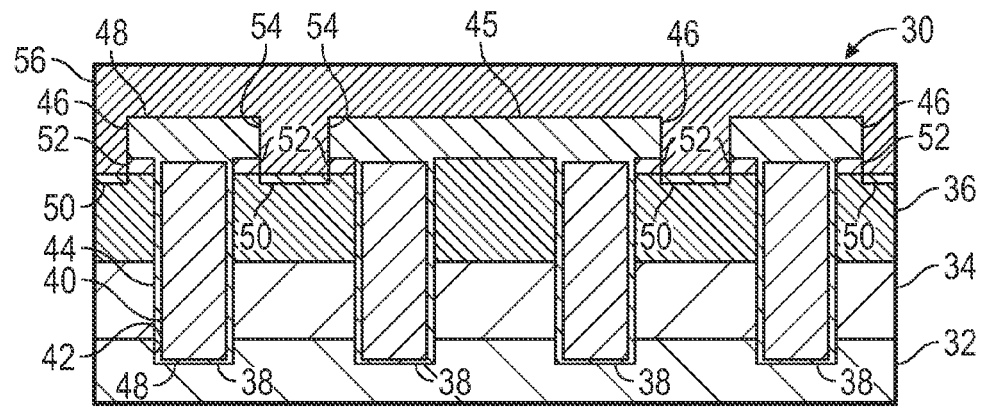
FIG. 2 is a cross-section view of a conventional injection enhanced gate transistor (IEGT)

Referring now to FIG. 2, a cross-section view of a conventional injection enhanced gate transistor (IEGT) 30 is shown. For the purposes of this disclosure, an IEGT is a variation of an IGBT. IEGT 30 is a punch-through IEGT due to the addition of an N+ buffer semiconductor layer 32. An N− semiconductor layer 34 and P− semiconductor layer 36 are included and coupled to the semiconductor layer 32. Gate trenches 38 are formed and filled with a trench material 40, which may be any similar material described above for IGBT 2. The inner wall 42 of each gate trench has an electrically insulative coating/layer 44 formed of an insulator 45, which may be $SiO_2$. The electrically insulative coating 44 electrically insulates the gate trench 38 from the plurality of semiconductor layers 32, 34, 36. An electrically insulative layer 46, formed of an insulator 48, which may also be $SiO_2$, is included. Non-overlapping P+ PSD regions 50 and N+ NSD regions 52 are included. Contact openings 54 are formed in the electrically insulative layer which allow the electrically conductive layer 56, which may be aluminum or any other electrically conductive material, to electrically contact the PSD and NSD regions. The electrically insulative layer 46 electrically isolates the gate trenches 38 from the electrically conductive layer 56. An injection/collector semiconductor layer may be included and coupled with the backside (bottom in the figure) of semiconductor layer 32, and may be a P+ layer.

Figure 3:
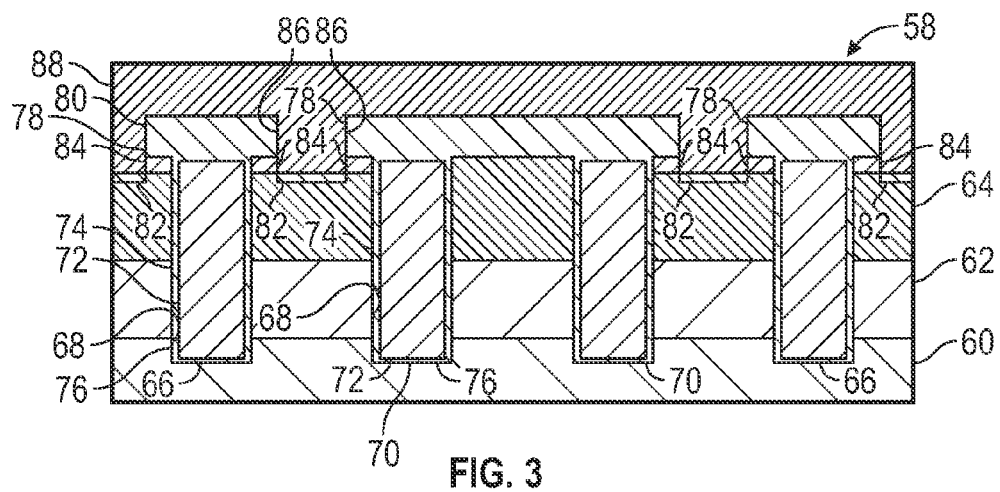
FIG. 3 is a cross-section view of a conventional low gate capacitance IEGT.

Referring to FIG. 3, a cross-section view of a conventional low gate capacitance IEGT 58 is shown. IEGT 58 is a punch through IEGT due to the addition of an N+ buffer semiconductor layer 60. An N− semiconductor layer 62 and P− semiconductor layer 64 are also included. Gate trenches 66 and emitter trenches 70 are formed and filled with a trench material 72, which may be any similar material described above for IGBT 2. An electrically insulative coating/layer 74 is included on the inner wall 68 of each trench, formed of an insulator 76 which may be SiO$_2$. The electrically insulative coating electrically insulates the gate trench from the plurality of semiconductor layers. An electrically insulative layer 78, formed of insulator 80 (which may be SiO$_2$), is included, and has a plurality of contact openings 86 formed therein. An electrically conductive layer 88, which may be formed of aluminum or any other electrically conductive material, electrically contacts non-overlapping P+ PSD regions 82 and N+ NSD regions 84 through the contact openings. The electrically insulative layer electrically isolates the gate trenches from the electrically conductive layer. An injection/collector semiconductor layer may be included below (and coupled with) semiconductor layer 60, and may be a P+ layer.

Figure 4:
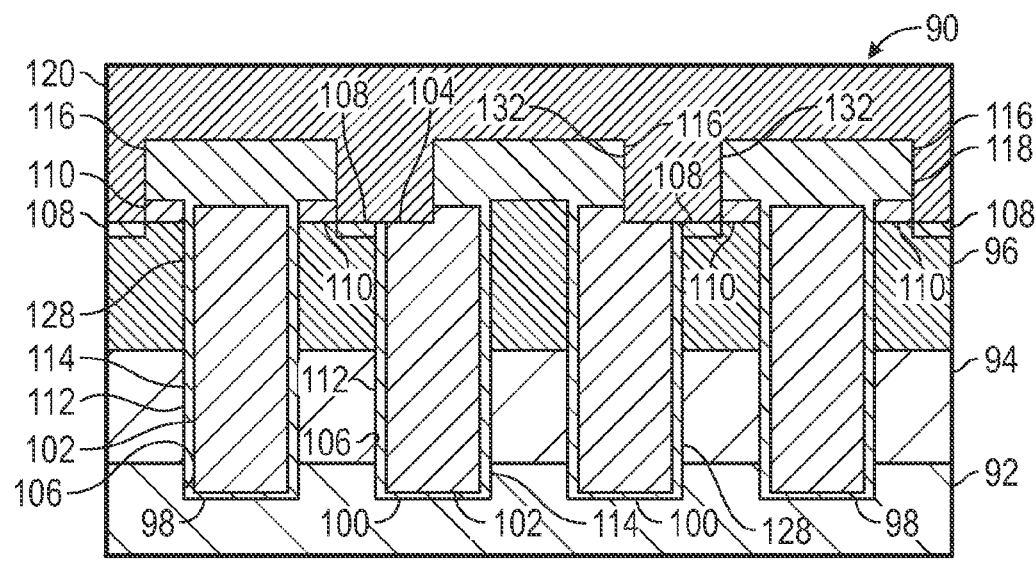
FIG. 4 is a cross-section view of an implementation of an IEGT.

Referring now to FIG. 4, a narrow pitch low gate capacitance IEGT 90 implementation is illustrated. IEGT 90 is a punch-through IGBT due to the presence of an N+ buffer semiconductor layer 92. An N− semiconductor layer 94 and P− semiconductor layer 96 are also included. In various other implementations, however, an N− layer may not be included at all. A plurality of trenches 128 are formed in the semiconductor layers, including a plurality of emitter trenches 100 between a plurality of gate trenches 98. Each trench is filled with a trench material 102. The trench material may be, by non-limiting example, a conductor, a metal, a doped polysilicon, any other trench material disclosed herein, and the like. Each trench has an electrically insulative coating/layer 112 on an inner wall 106. The electrically insulative coating is formed of an insulator, which in implementations is SiO$_2$, though other electrically insulative materials could be used in various implementations. The electrically insulative coating electrically insulates the gate trench from the plurality of semiconductor layers 92, 94, 96.

A non-overlapping P+ PSD region 108 and N+ NSD region 110 are formed between each gate trench and emitter trench. An electrically insulative layer 116 is formed of an insulator 118, which in implementations is SiO$_2$, though in other implementations other electrically insulative materials may be used. Contact openings 132 are formed in the electrically insulative layer. In the implementation illustrated, an exposed surface 104 of the trench material within each emitter trench 100 is formed during the process of forming the contact openings 132. An electrically conductive layer 120 is deposited and electrically contacts the exposed surface 104, along with the NSD and PSD regions. The electrically conductive layer may be formed of aluminum, but in implementations other electrically conductive materials may be used.

The electrically insulative layer 116 electrically isolates the gate trenches 98 from the electrically conductive layer 120. The contact openings 132 extend into the emitter trenches 100, as can be seen. An injection/collector semiconductor layer may be included below, and coupled with, the N+ buffer semiconductor layer 92, and the injection/collector semiconductor layer may be a P+ layer. The electrically conductive layer 120 is electrically coupled with the plurality of semiconductor layers 92, 94, 96 through the PSD region 108 and/or the NSD region 110. The emitter trenches 100 are not electrically coupled with the plurality of semiconductor layers 92, 94, 96 except through the electrically conductive layer 120.

Figure 5:
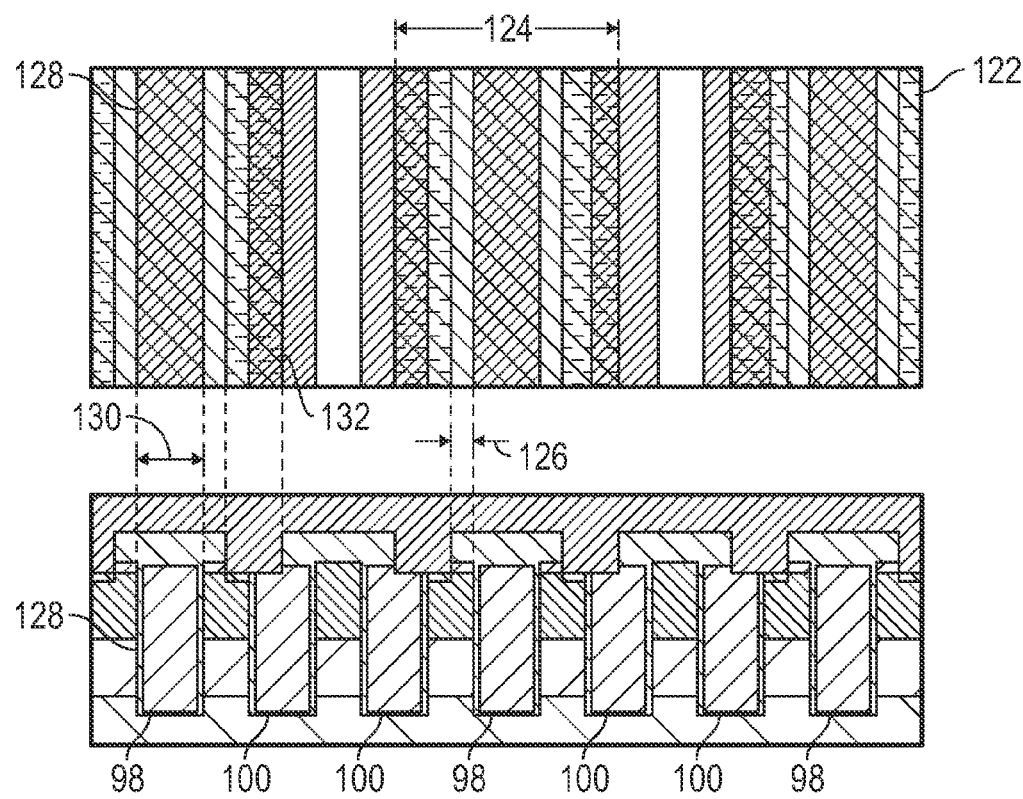
FIG. 5 is a cross-section view of an implementation of an IGBT with an associated mask pattern.

FIG. 5 shows a more extensive cross-section view of the IEGT 90 illustrated in FIG. 4 and includes a mask pattern 122 that corresponds with IEGT 90. The mask pattern 122 shows a top view of various portions of IEGT 90 including trenches 128, contact openings 132, and first NSD widths 124. The NSD regions, as shown, may be wider when first deposited, having first NSD width 124, then may be reduced in size (such as by removing some of the material through forming the contact opening or to form other elements of IEGT 90) to second NSD width 126 which is narrower than first NSD width 124. In other implementations the NSD regions 110 may be originally formed to their intended final size. Each trench 128 has a trench width 130 as shown.

The specific material types disclosed here (P+, P−, N+, N−) and their respective positions within IEGT 90 could be varied to form various other implementations of an IEGT/IGBT each of which includes a contact opening exposing an exposed surface of the emitter trench(es) to the electrically conductive layer. Forming the contact opening 132 in such a way that the trench material of the emitters is exposed, through exposed surfaces 104, allows the trench material of the emitters to be electrically coupled with a region of the semiconductor layers between the gate trench and emitter trench when the electrically conductive material is deposited.

As can be seen by comparing FIG. 3 with FIG. 4, by designing the IEGT 90 such that the electrically conductive layer is able to be in direct contact with the trench material of the emitter trenches, the contact opening 132 is able to be formed having the same width as contact opening 86, but the trenches 128 are now able to be spaced closer together. The contact opening for IEGT 90 does not need to be spaced smaller than the spacing between trench electrodes. In other words, the trenches are able to be spaced closer together (more narrowly) than the width of the contact opening. Some existing processes and devices to form contact openings are limited in their ability to form smaller-width contact openings. Accordingly, allowing the contact opening to remain the same dimension, while moving the trenches closer together, may reduce die and package size, allowing IEGT 90 to take up less space than IEGT 58, without having to utilize any different fabrication tools/devices/processes during the formation of the contact opening 132 or the rest of IEGT 90.

Also, forming the trenches closer together and placing a contact opening of the same size as those previously used, but in such a way that it opens the emitter trench, may allow for a reduction in overall process steps while using existing process tools and techniques. Implementations of the new method may include removing an insulative material (such as an oxidation film) over the emitter trench, to expose the trench material, while at the same time removing an insulative material separating the trench material from a region in the plurality of semiconductor layers between the gate trench and emitter trench, during formation of the contact opening. The method may also include when depositing the electrically conductive layer, electrically coupling the electrically conductive layer with the trench material of the emitter trench, and simultaneously electrically coupling the electrically conductive layer with a region of the plurality of semiconductor layers between the gate trench and the emitter trench, and simultaneously electrically coupling the trench material of the emitter trench with the region of the plurality of semiconductor layers between the gate trench and the emitter trench.

In some implementations the methods and structures described herein may rely on the structure not needing to have a contact opening between neighboring emitter trenches, or, in other words, not needing to have a contact opening coupling the electrically conductive layer with the plurality of semiconductor layers between two neighboring emitter trenches. In some implementations the methods and structures described herein may rely on there being little or no negative impacts from reducing the spacing between neighboring emitter trenches and/or reducing the spacing between trenches in general.

Figure 8:
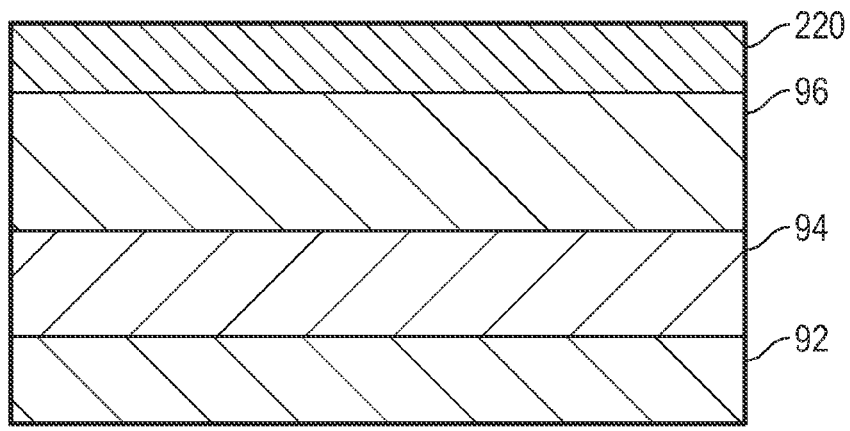
FIG. 8 is a cross-section view of a structure used in forming an implementation of an IGBT, the structure including a plurality of semiconductor layers.

Reference is now made to FIGS. 8-14, which representatively illustrate various steps used in a method of forming an implementations of an IEGT 90. FIG. 8 shows the semiconductor layers 92, 94, and 96 in a stacked/layered configuration with an oxide layer 220 on top of (and coupled with) semiconductor layer 96. Note that the semiconductor layer 96 may not begin as a P− semiconductor layer but may be later altered to be a P− semiconductor layer, as will be described hereafter. The oxide layer may be formed of $SiO_2$ and may, by non-limiting example, be present in some implementations to temporarily protect the rest of the semiconductor layers from oxidation or other downstream processing operations. The oxide layer may be formed by natural oxidation of the top semiconductor layer 96 in various implementations. In other implementations, the oxide layer 220 may be a sacrificial oxide layer.

Various of the semiconductor layers may be formed by implantation followed by diffusion processing. For example, the N− layer, N+ layer, P+ layer, and P− layers may be formed by implanting dopants into a substrate at high energy and then performing a diffusion step such as by using a specified increased temperature for a specified amount of time. In various implementations all the layers could be implanted first, and then diffused, and in other implementations there could be multiple diffusion steps, such as one after each implantation step. Some of the implantation steps may involve high energy implantation to implant at a greater depth into the substrate than other implantation steps.

The IGBT/IEGT may include structures/characteristics of other semiconductor devices such as a metal-oxide-silicon field-effect transistor (MOSFET), a junction-gate field-effect transistor (JFET), and the like. The IGBT/IEGT may, for example, include all of the elements of a MOSFET or JFET and add other structures to form the IGBT/IEGT. Accordingly, the implantation and diffusion steps, and other fabrication steps, may include processing steps and operations similar to those used for making these other devices.

Figure 9:
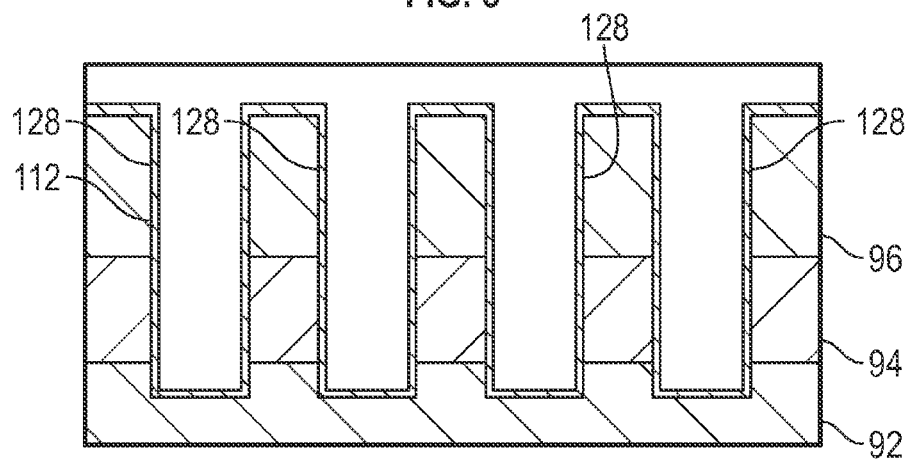
FIG. 9 is a cross-section view of the structure of FIG. 8 with a plurality of trenches formed and an electrically insulative coating added.
Figure 10:
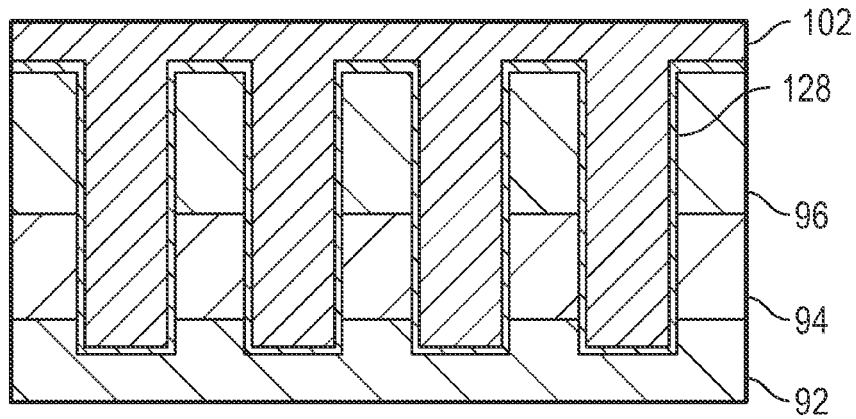
FIG. 10 is a cross-section view of the structure of FIG. 9 with a trench material added.
Figure 11:
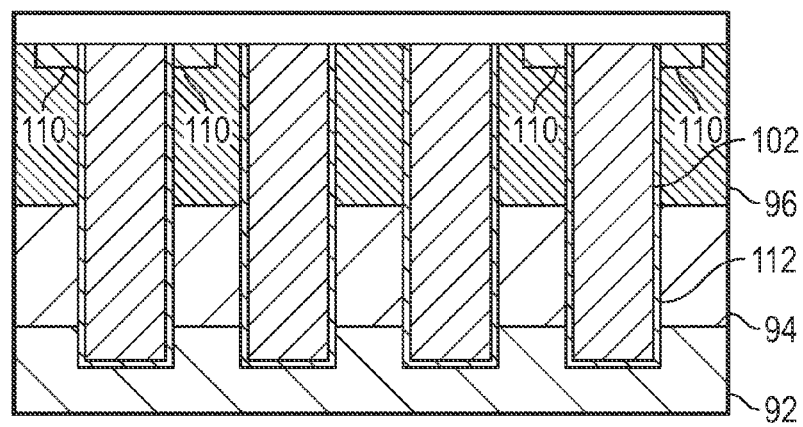
FIG. 11 is a cross-section view of the structure of FIG. 10 after removal of a portion of the structure and addition of N surface doped (NSD) regions.

Referring now to FIG. 9, the oxide layer 220 has been removed in a previous processing steps and a plurality of trenches 128 are formed through an etching process. The electrically insulative coating/layer 112 is then deposited over the structure (and accordingly on the inner walls 106 of the trenches). As described above, the electrically insulative coating 112 comprises an insulator 114 which in the illustrated implementation is $SiO_2$ (this step may also involve the addition and removal of sacrificial $SiO_2$), though other electrically insulative materials could be used. The $SiO_2$ (or other electrically insulating material) forms the gate oxide of the device. FIG. 10 shows the structure following deposition of the trench material 102, which in the implementation illustrated is doped polysilicon. FIG. 11 shows the structure following etching back. The semiconductor layer 96 is then implanted (and a diffusion process is performed) so that semiconductor layer 96 becomes a P well layer. The NSD regions 110 are the subsequently created formed through implantation.

Figure 12:
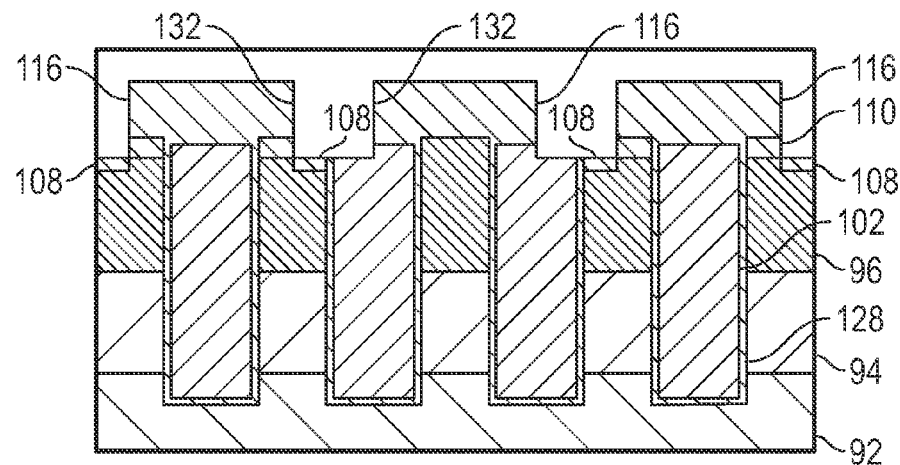
FIG. 12 is a cross-section view of the structure of FIG. 11 after the addition of an electrically insulative layer, the creation of a plurality of contact openings, and the addition of P surface doped (PSD) regions.

Referring to FIG. 12, an electrically insulative layer 116 is then formed using an insulator 118, which in this case includes borophosphosilicate glass (BPSG). Contact openings 132 are then formed through etching processes to etch through the BPSG and then the $SiO_2$, forming an exposed surface 104 of the trench material 102 (and in various implementations etching through some of the trench material, as illustrated in FIG. 12). The PSD regions 108 are then formed through implantation.

Figure 13:
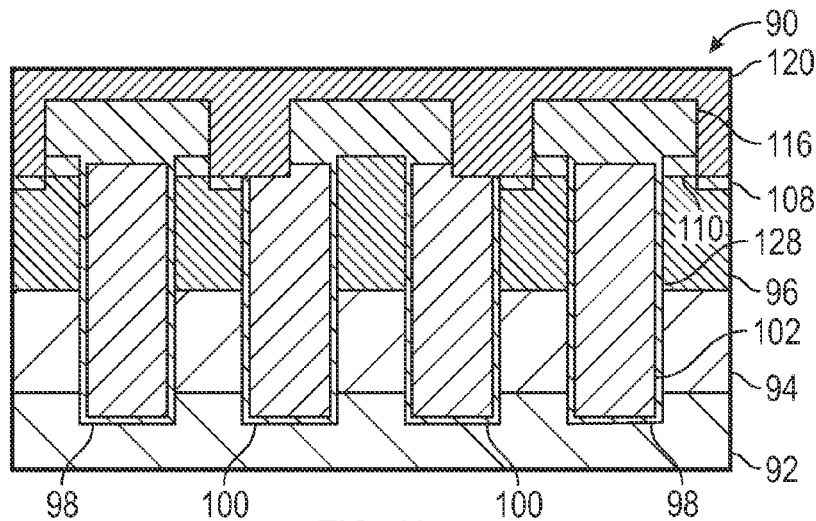
FIG. 13 is a cross section view of the IEGT of FIG. 4 formed by adding an electrically conductive layer to the structure of FIG. 12.
Figure 14:
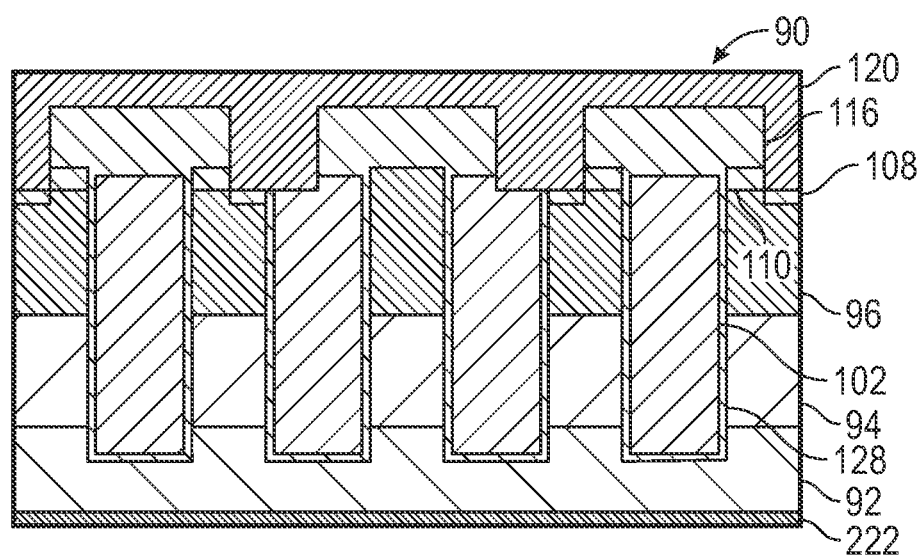
FIG. 14 is a cross section view of the IEGT of FIG. 13 with an injection/collector layer added.

Referring to FIG. 13, the electrically conductive layer 120 is then deposited/sputtered. In the implementation illustrated, the electrically conductive layer 120 is made of aluminum, though in other implementations, any electrically conductive material could be used. In various implementations the aluminum upper surface may be etched, a jacket layer deposited, and the jacket layer etched. Referring to FIG. 14, an injection/collector semiconductor layer 222 may then be deposited or formed on the backside, either through deposition or implantation, and may in this case be a P+ layer.

Various variations/process flows involving the above steps may be used by the practitioner of ordinary skill in the art depending on the specific configuration of an IEGT/IGBT and the functions of the various layers. In implementations a P+ layer may be an injecting/collector layer, an N+ layer may be a buffer layer (as has been described above for punch-through purposes), a N− layer may be a collector drift region layer, and so forth, though other configurations may be formed. Although the steps above are described in a specific sequence, the specific sequence is only a representative example, and in other implementations several of the same steps or other steps could be done in different order(s) to achieve the same IEGT/IGBT structure. Naturally, various etching materials (such as masks) and processes, sacrificial oxides, photolithography/photoresist materials and processes, implantation materials (dopants) and processes, diffusion processes, washing/cleaning processes, and the like, may be included in the above mentioned process, which has generally been described in simplified format.

Figure 6:
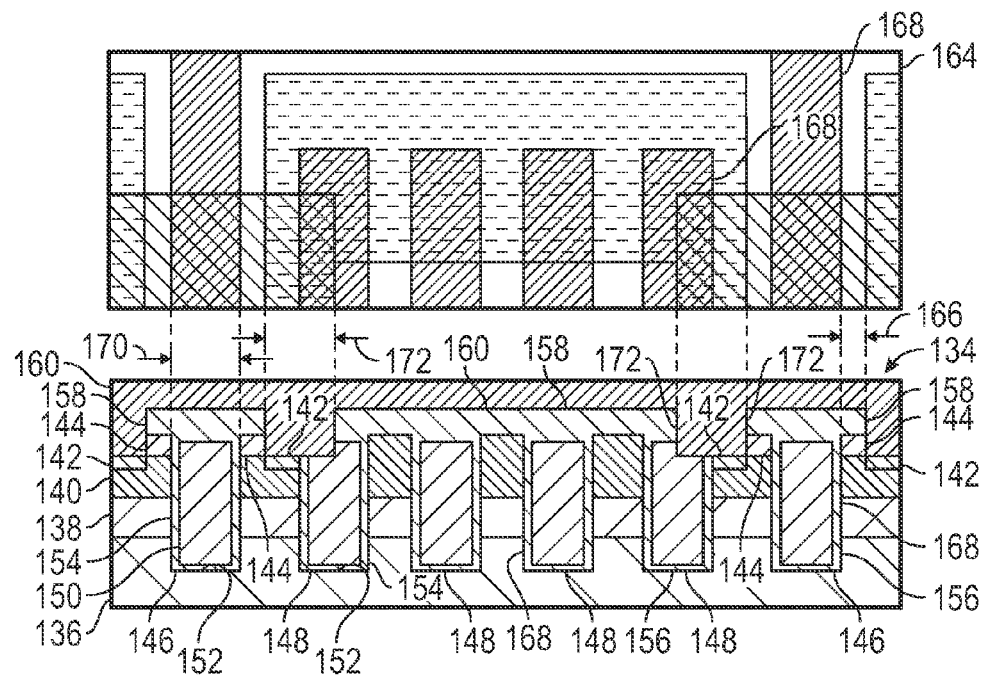
FIG. 6 is a cross-section view of an implementation of an IGBT with an associated mask pattern.

Referring now to FIG. 6, a cross-section view of an IGBT 134 is shown, along with a mask pattern 164 corresponding with the IGBT 134 (i.e., a mask pattern used in making the IGBT 134). IGBT 134 includes an N− semiconductor layer 138, an N+ semiconductor layer 136 (which is a buffer layer, making this a punch-through IGBT), and a P− semiconductor layer 140. A non-overlapping P+ PSD region 142 and N+ NSD region 144 are located between gate and emitter trenches, as shown. The gate trenches 146 and emitter trenches 148 are organized so that there are two emitter trenches neighboring each gate trench but so that there are several emitter trenches between each pair of gates. Each trench 168 is filled with a trench material 150 which may be any of the aforementioned materials. The inner wall 152 of each trench includes an electrically insulative coating 154 of an insulator 156, which in implementations is $SiO_2$, though it could be formed of other insulative materials. The electrically insulative coating electrically insulates the gate trench from the plurality of semiconductor layers.

An electrically insulative layer 158 is included and is formed of an insulator 160, which may be $SiO_2$, BPSG, or some other insulative material. Contact openings 172 are formed in the electrically insulative layer 158 which expose the PSD and NSD regions along with the trench material of some of the emitter trenches (though, as described earlier, the PSD and/or NSD regions could be formed after making the contact openings). The electrically conductive layer 162, which may be formed of aluminum or some other electrically conductive material, contacts the trench material of some of the emitter trenches along with the NSD and PSD regions. The mask pattern 164 illustrates a top view of the mask pattern of the device which shows the various trenches 168 each having a similar trench width 170. As described above with respect to other implementations, the NSD region may originally be a wider width and then may be narrowed down through etching or other material removal techniques or the equivalent, to form a second NSD width 166, though in implementations the NSD region may originally be formed to have the second NSD width.

The electrically insulative layer 158 electrically isolates the gate trenches from the electrically conductive layer 162. The contact openings 172 extend into the emitter trenches 148, as is illustrated. An injection/collector semiconductor layer may be formed at the bottom of semiconductor layer 136, and in implementations the injection/collector semiconductor layer may be a P+ layer. The electrically conductive layer 162 is electrically coupled with the plurality of semiconductor layers through the PSD region and/or NSD region, as shown. The emitter trenches are not electrically coupled with the plurality of semiconductor layers except through the electrically conductive layer.

Figure 7:
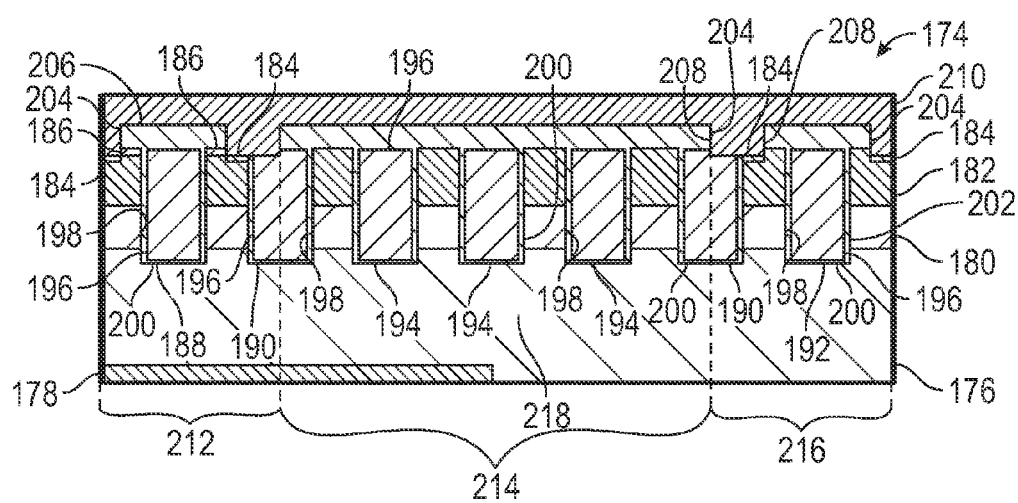
FIG. 7 is a cross-section view of an implementation of a reverse conducting IGBT (RC-IGBT)

FIG. 7 shows a representative example of a reverse conducting IGBT (RC-IGBT) 174. RC-IGBT 174 is a punch-through IGBT, having an N+ buffer semiconductor layer 176. RC-IGBT 174 incorporates an IGBT and a freewheeling diode (FWD). A P+ injection/collector semiconductor layer (injection/collector region) 178, N− semiconductor layer 180, and P− semiconductor layer 182 are included. Any of these layers/regions may be formed with techniques described herein or those known in the art or hereafter discovered. A plurality of trenches are formed, and each of these includes an electrically insulative coating 200 of an insulator 202 (which in implementations is $SiO_2$, but which may be formed of other electrically insulative materials), on an inner wall 198. The electrically insulative coating electrically insulates the gate trench(es), the diode trench(es) 192, and the inactive trenches 194 from the plurality of semiconductor layers, and locally isolates the emitter trenches from the semiconductor layers though the emitter trenches are electrically coupled with the semiconductor layers through an electrically conductive layer, as will be described hereafter. A trench material 196 fills each trench, which may include any of the trench materials described herein.

A gate trench 188 is shown at the left of the figure, having a P+ PSD region 184 and an N+ NSD region 186 between it and its nearest emitter trench 190 neighbors. The PSD and NSD regions are non-overlapping. A number of inactive trenches 194 are formed between emitter trenches. Below the inactive trenches a hole store area 218 is formed, which in implementations may provide for faster operation, changing low resistance by resulting conductivity modulation, high short circuit tolerance due to the limited current that can pass by the invalidity region, and/or other desirable operating conditions for the IGBT. A diode trench 192 is shown at the right of the figure, having a PSD region 184 between it and its nearest emitter trench neighbor. The gate trench 188 and neighboring emitter trench 190 thus form an IGBT area 212, the inactive trenches 194 form an invalidity area 214 having the hole store area below them, and the diode trench 192 and its neighboring emitter trench 190 form a diode area 216.

As with other IGBT/IEGTs described herein, an electrically insulative layer 204 is formed of an insulator 206, which may be $SiO_2$, BPSG, or some other electrically insulative material. Contact openings 208 are formed, which expose the trench material of active emitter trenches and which also allow an electrically conductive layer 210 to be in electrical communication with the emitter trench material and also with the NSD and PSD regions at the IGBT area. At the diode area the contact opening allows the electrically conductive layer to be in electrical contact with the PSD region, the emitter trench material, and the P− semiconductor layer 182. In other implementations, an electrical insulator could block the electrically conductive layer from electrically coupling with the P− semiconductor layer 182 proximate the diode trench so that the electrically conductive layer electrically couples with the P− layer proximate the diode trench only through the nearby PSD region. In various implementations the electrically conductive layer 210 is formed of aluminum, though in other implementations it may be formed of other electrically conductive materials.

The electrically insulative layer electrically isolates the gate trench(es), the inactive trenches, and the diode trench(es) from the electrically conductive layer. The contact openings 208 extend into the emitter trenches 190, as can be seen, and the electrically conductive layer is coupled with the plurality of semiconductor layers through the PSD region and/or the NSD region at the IGBT area. The emitter trenches 190 are not electrically coupled with the plurality of semiconductor layers except through the electrically conductive layer 210.

The P+ injection/collector region 178 may serve as an IGBT contact and the bottommost portion of the N+ buffer semiconductor layer 176 may serve as a diode contact.

In various implementations, the structures and methods described herein may result in the following characteristics for IEGTs/IGBTs compared with conventional IGBTs/IEGTs without requiring different or new wafer process equipment to be used: a reduced saturation voltage (VCE (sat)) reduced by, or by about, 30% (calculated by simulations); a reduced input capacitance ($C_{ies}$) by about 20% (using emitter level trench); an over 30 kHZ power factor correction (PFC); lower capacitance; lower gate capacitance; lower loss when used as in inverter (about 35 Watts (W) at $P_{OFF}$, about 18 W at $P_{ON}$, and about 5 W at $P_{VCE(sat)}$); lower loss when used as a PFC (about 45 W at $P_{OFF}$, about 20 W at $P_{ON}$, and about 10 W at $P_{VCE(sat)}$); a reduced switching speed, and; longer short circuit withstand time ($T_{SC}$).

In places where the description above refers to particular implementations of IGBTs and related methods and implementing components, sub-components, methods and sub-methods, it should be readily apparent that a number of modifications may be made without departing from the spirit thereof and that these implementations, implementing components, sub-components, methods and sub-methods may be applied to other IGBTs and related methods.

What is claimed is:

1. An insulated gate bipolar transistor (IGBT), comprising: a gate trench; an emitter trench; an electrically insulative layer coupled to the emitter trench and to the gate trench and electrically isolating the gate trench from an electrically conductive layer, and; an opening in the electrically insulative layer that extends into the emitter trench and extends into a doped semiconductor layer located between the emitter trench and the gate trench; wherein the electrically conductive layer electrically couples with the emitter trench through the opening in the electrically insulative layer; and wherein the gate trench, the emitter trench, the electrically insulative layer and the electrically conductive layer form at least a part of the insulated gate bipolar transistor (IGBT).

2. The IGBT of claim 1, further comprising a P surface doped (PSD) region and an N surface doped (NSD) region located between the electrically conductive layer and a plurality of semiconductor layers of the IGBT.

3. The IGBT of claim 2, wherein the PSD region and the NSD region substantially do not overlap.

4. The IGBT of claim 2, wherein the PSD region and the NSD region are located between the gate trench and the emitter trench and wherein the electrically conductive layer is electrically coupled to the plurality of semiconductor layers through one of the PSD region and the NSD region.

5. The IGBT of claim 1, wherein the IGBT further comprises a plurality of semiconductor layers comprising at least a P+layer, a P−layer, and an N−layer between the P+layer and the P−layer.

6. The IGBT of claim 5, further comprising an N+layer between the P+layer and the N−layer.

7. The IGBT of claim 1, wherein the gate trench and the emitter trench each extends into at least two semiconductor layers of the IGBT.

8. The IGBT of claim 1, wherein the gate trench is electrically insulated from a plurality of semiconductor layers of the IGBT using an insulator.

9. The IGBT of claim 1, wherein the IGBT further comprises a plurality of semiconductor layers and wherein the emitter trench is not electrically coupled with the plurality of semiconductor layers except through the electrically conductive layer.

10. The IGBT of claim 2, wherein the opening in the electrically insulative layer contacts an upper edge of the PSD region and contacts a side of the NSD region.

* * * * *